(12) United States Patent
Takashima

(10) Patent No.: US 9,209,030 B2
(45) Date of Patent: Dec. 8, 2015

(54) NONVOLATILE MEMORY

(71) Applicant: KABUSHIKI KAISHA TOSHIBA, Tokyo (JP)

(72) Inventor: Daisaburo Takashima, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 98 days.

(21) Appl. No.: 13/960,396

(22) Filed: Aug. 6, 2013

(65) Prior Publication Data
US 2014/0284680 A1 Sep. 25, 2014

Related U.S. Application Data

(60) Provisional application No. 61/804,578, filed on Mar. 22, 2013.

(51) Int. Cl.
| | |
|---|---|
| *H01L 29/788* | (2006.01) |
| *H01L 21/28* | (2006.01) |
| *H01L 29/423* | (2006.01) |
| *H01L 29/66* | (2006.01) |
| *H01L 21/764* | (2006.01) |
| *H01L 27/115* | (2006.01) |

(52) U.S. Cl.
CPC ........ *H01L 21/28273* (2013.01); *H01L 21/764* (2013.01); *H01L 27/11521* (2013.01); *H01L 29/42324* (2013.01); *H01L 29/66825* (2013.01); *H01L 29/7881* (2013.01)

(58) Field of Classification Search
CPC ............ H01L 29/42324; H01L 21/764; H01L 29/66825; H01L 29/788; H01L 27/11517
See application file for complete search history.

(56) References Cited

U.S. PATENT DOCUMENTS

| | | |
|---|---|---|
| 2008/0217674 A1 | 9/2008 | Watanabe |
| 2010/0237398 A1 | 9/2010 | Kamigaichi et al. |
| 2014/0225179 A1* | 8/2014 | Aoyama ........................ 257/316 |

* cited by examiner

*Primary Examiner* — Whitney T Moore
(74) *Attorney, Agent, or Firm* — Holtz, Holtz, Goodman & Chick PC

(57) ABSTRACT

According to one embodiment, a nonvolatile memory includes the following structure. A first gate insulating film, a first floating gate, a second gate insulating film and a gate electrode are stacked on a semiconductor region between source and drain electrodes. A second floating gate is formed on a first side surface of the first floating gate. A first insulating film is formed between the first and second floating gates and has an air gap. A third floating gate is formed on a second side surface of the first floating gate on the opposite side of the first side surface. A second insulating film is formed between the first and third floating gates.

20 Claims, 12 Drawing Sheets

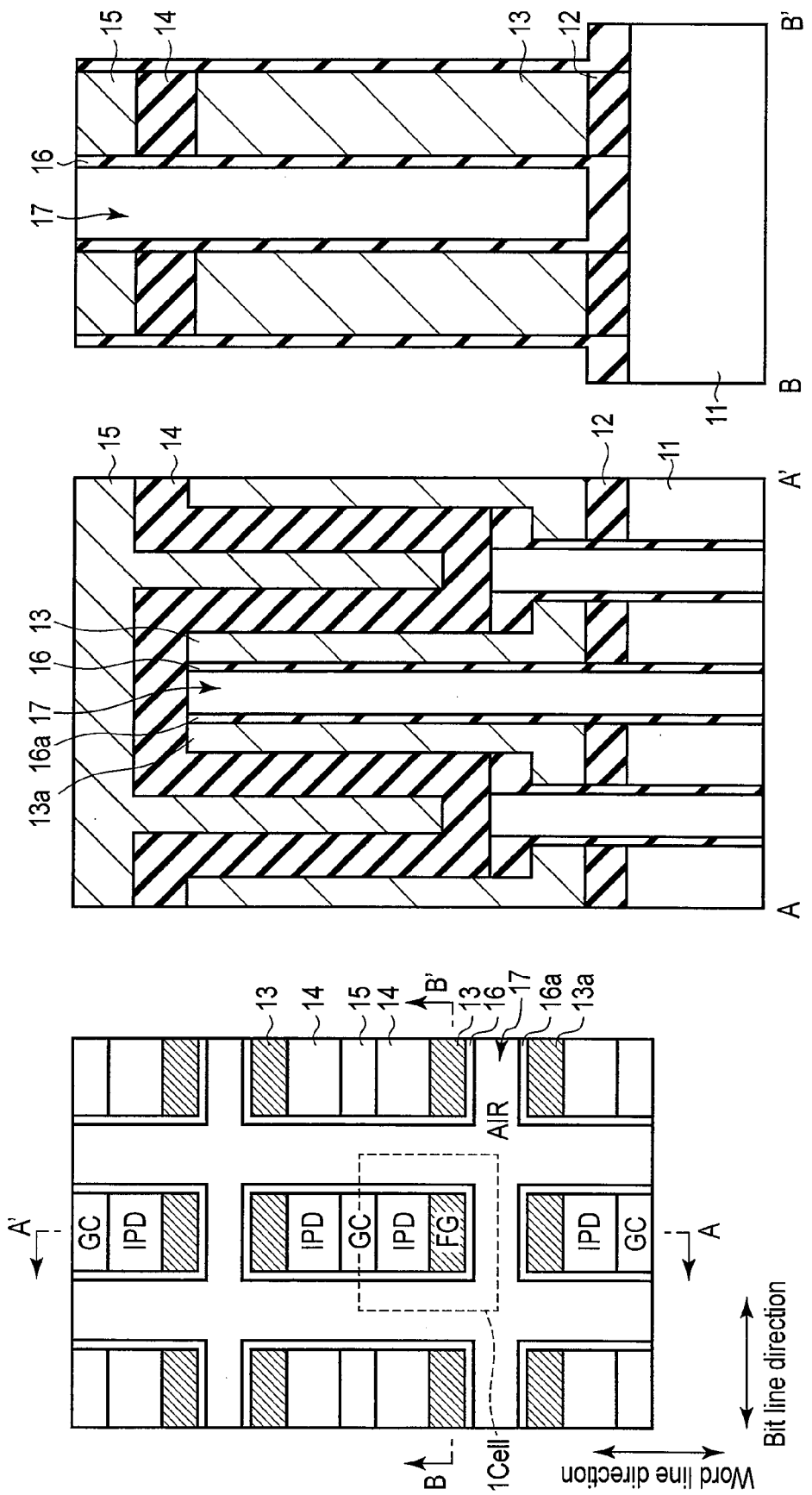

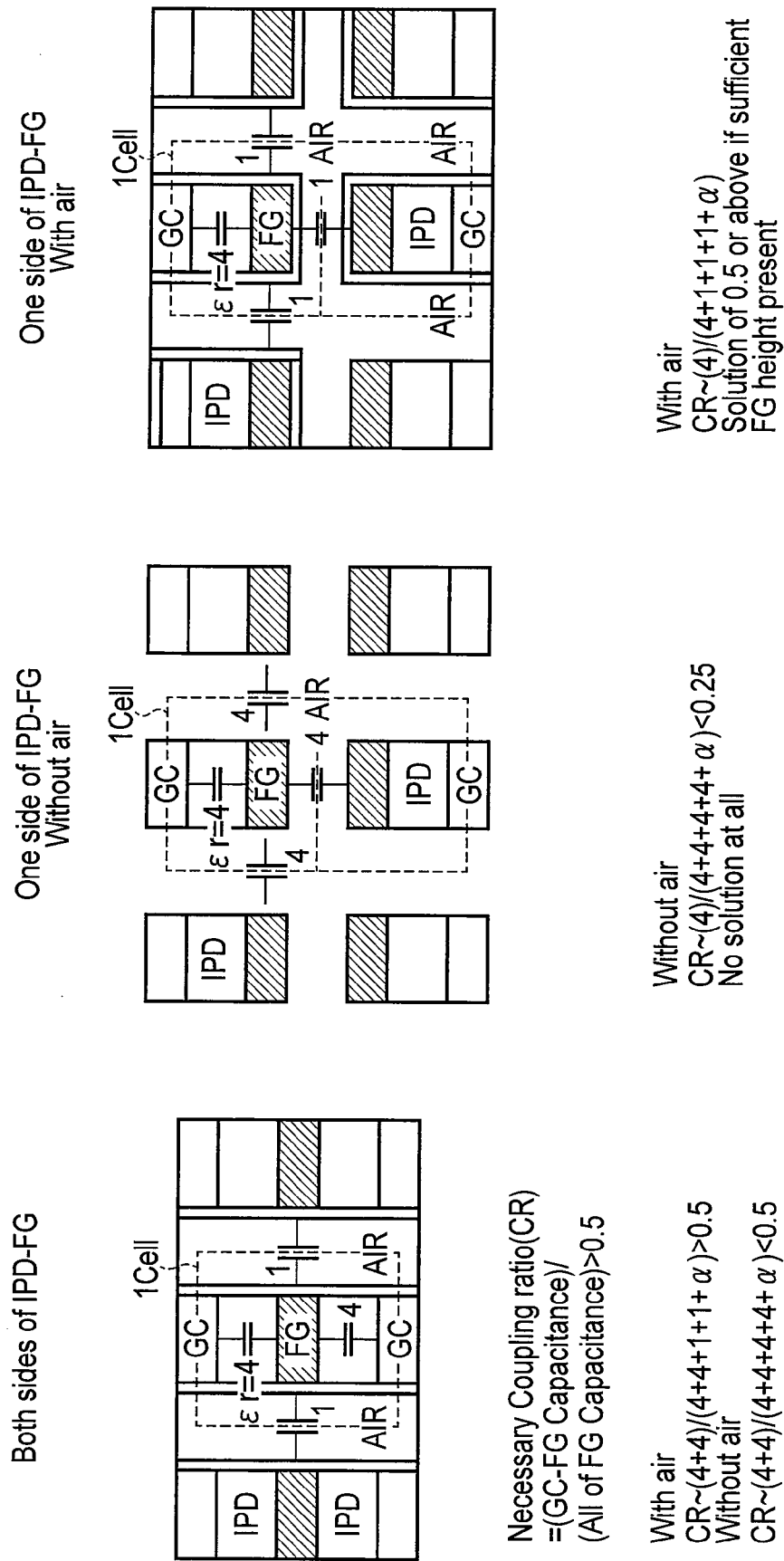

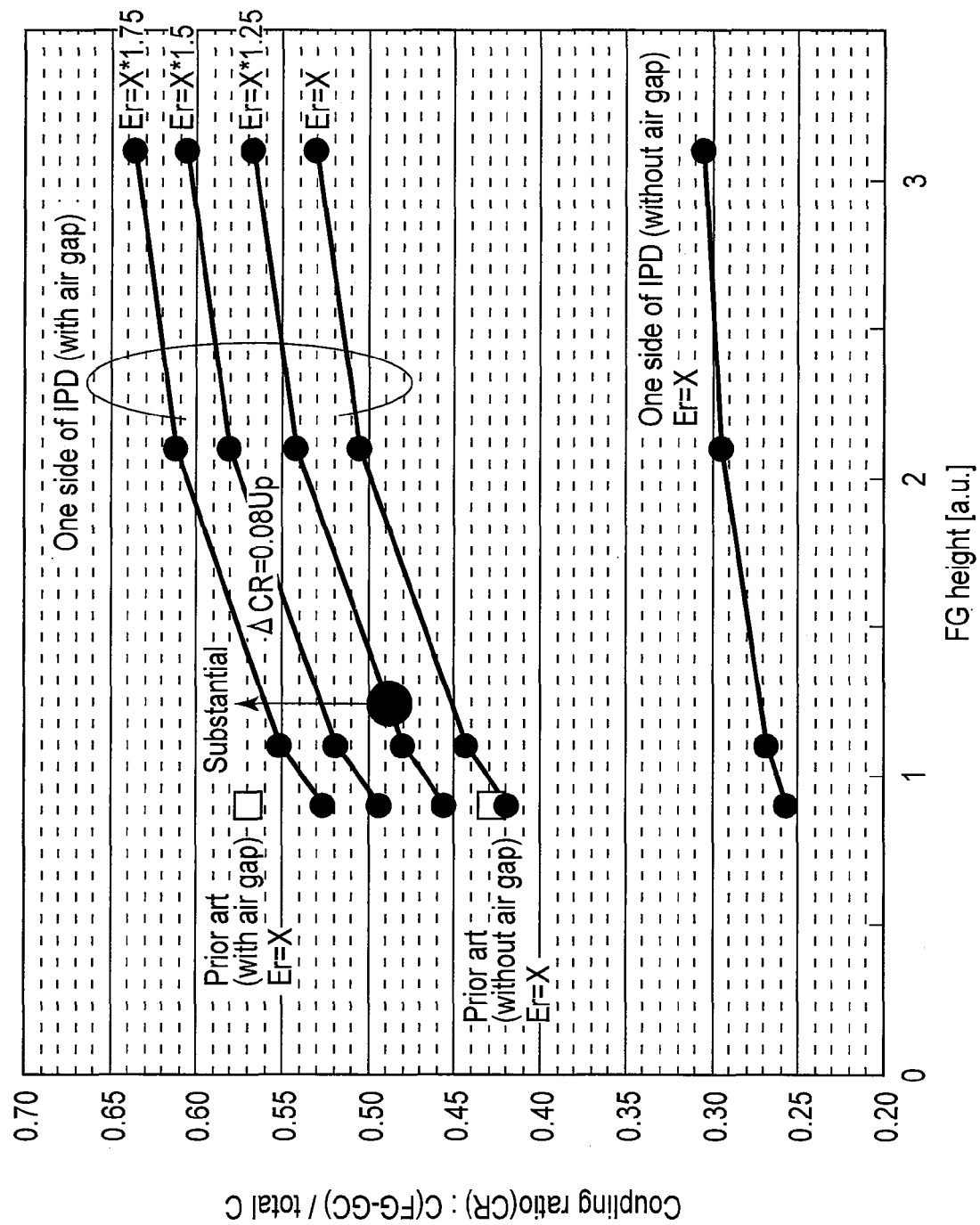
F I G. 4

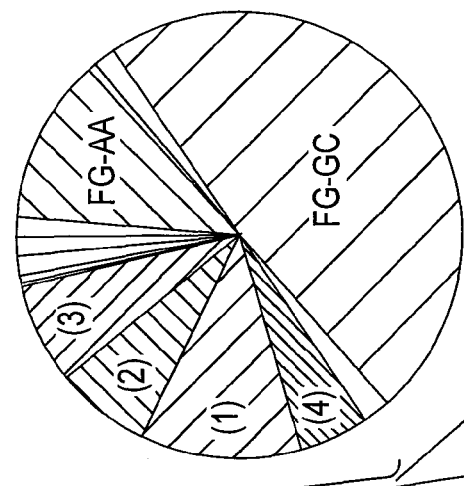
FIG. 5A
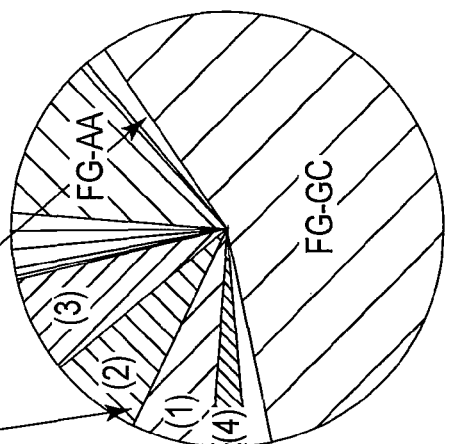
FIG. 5B
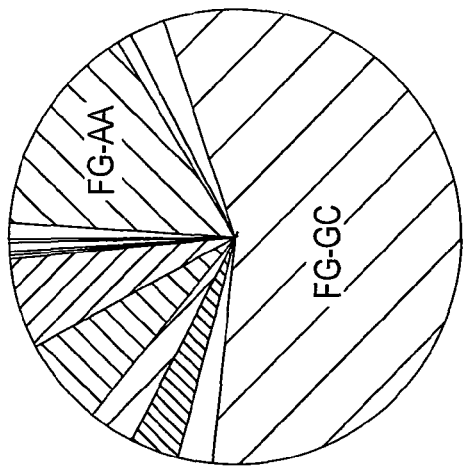
FIG. 5C
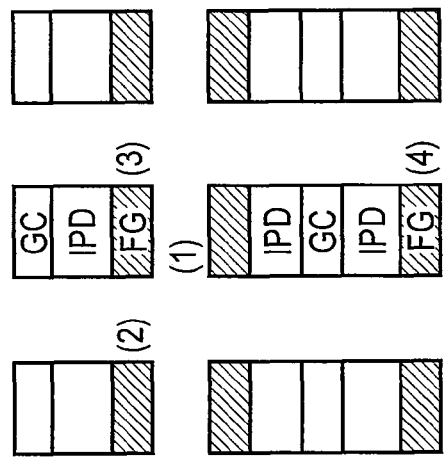
FIG. 5D
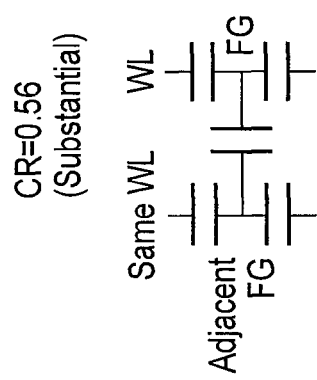

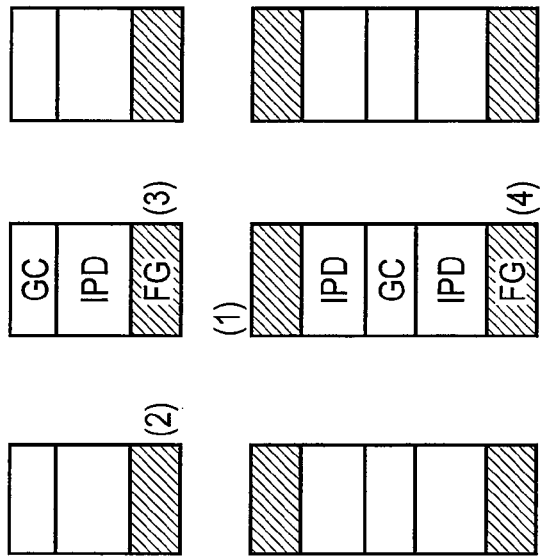
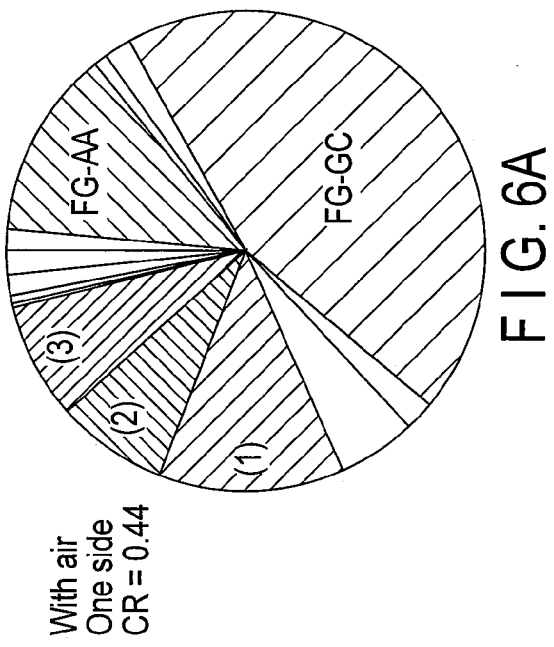
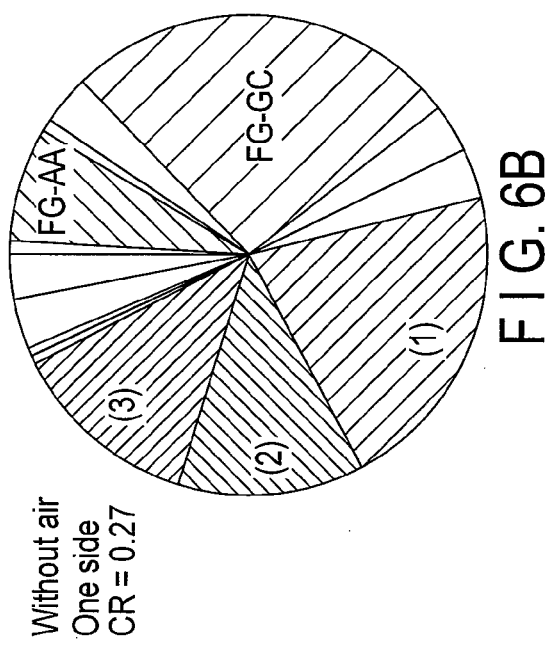
FIG. 6A
FIG. 6B
FIG. 6C

Target Vt(BL1)=N−K01N$_{BL0}$−K02N$_{BL2}$

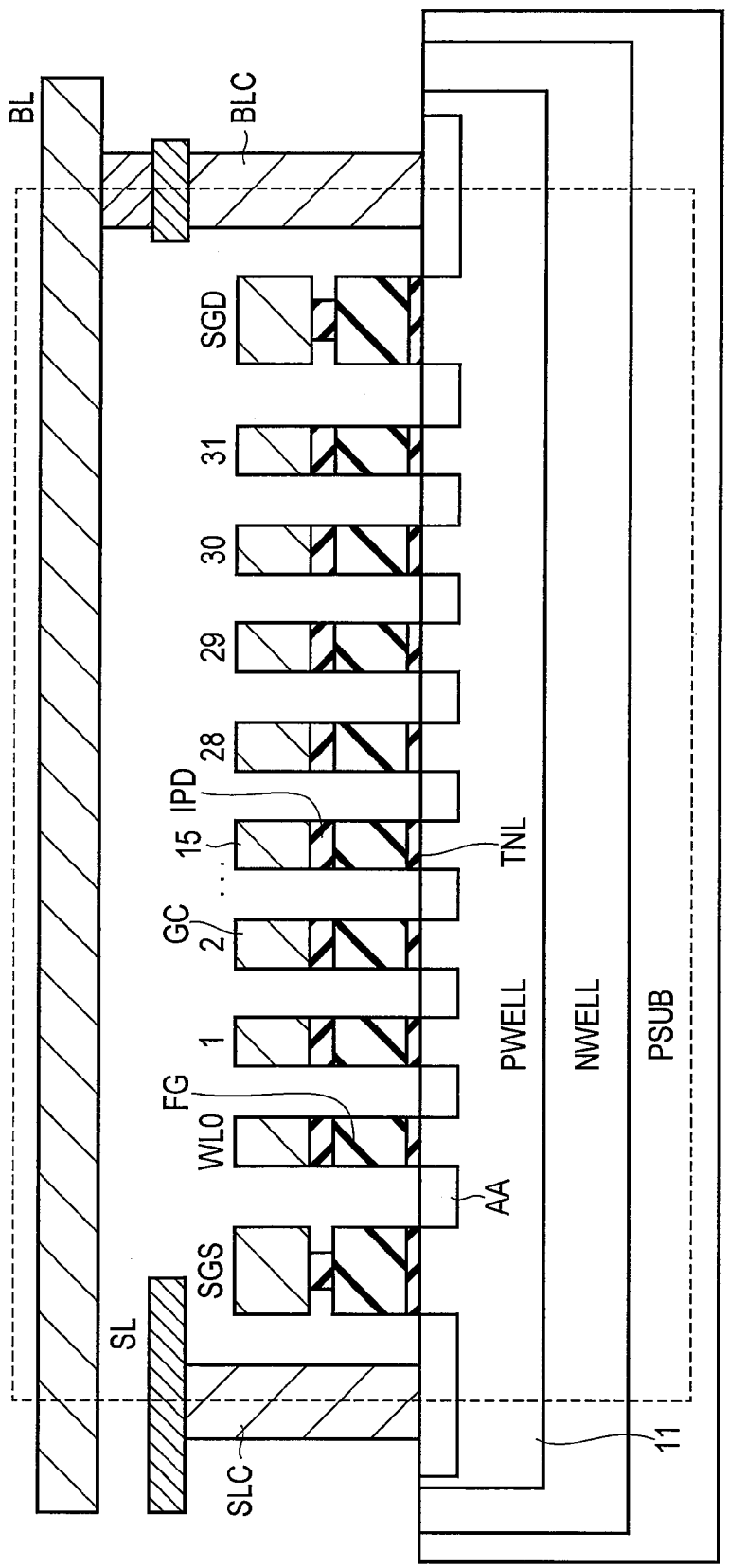
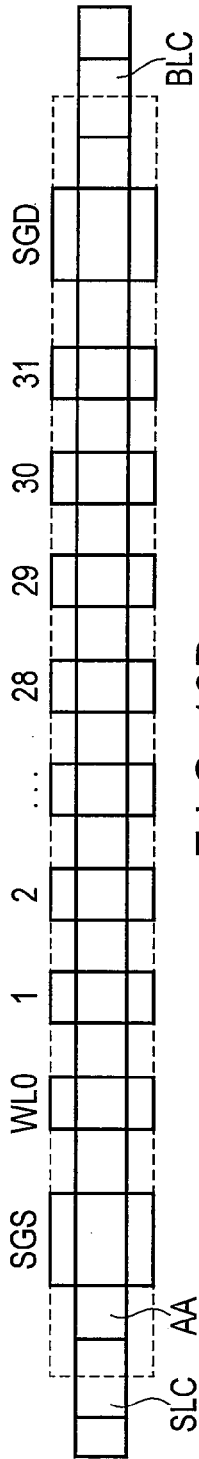
FIG. 10A
FIG. 10B

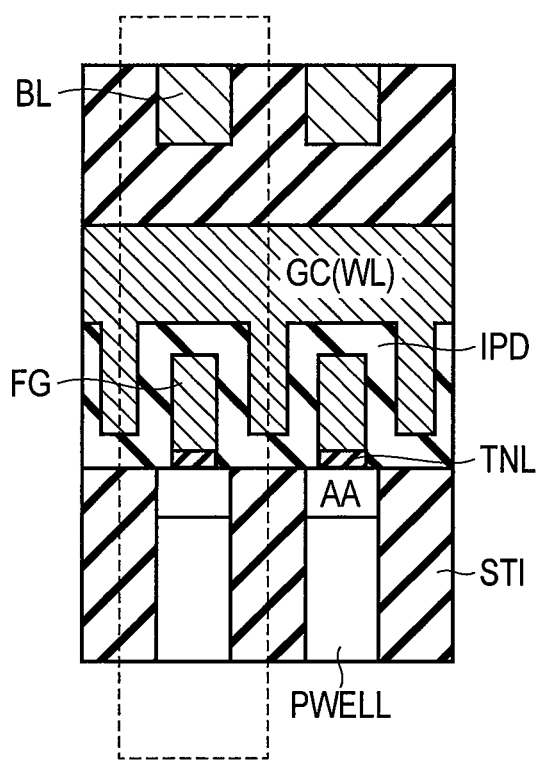
F I G. 11

NONVOLATILE MEMORY

CROSS-REFERENCE TO RELATED APPLICATIONS

This application claims the benefit of U.S. Provisional Application No. 61/804,578, filed Mar. 22, 2013, the entire contents of which are incorporated herein by reference.

FIELD

Embodiments described herein relate generally to a nonvolatile memory.

BACKGROUND

Nowadays, semiconductor memories are used in every device from a main memory of a large-scale computer to a personal computer (PC), a home electric appliance, a mobile phone, and others. Memories enlarging their markets include such a NAND flash memory (a NAND Flash EEPROM) as shown in FIGS. 10A and 10B, and various kinds of memory cards (a Secure Digital [SD], multimedia card [MMC], compact flash [CF] card) or flash drives are used as media that store information such as images, moving images, sound, games, and others, storage media of a digital camera, a digital video player, an MP3 music player or the like, a mobile phone, or a mobile PC, and storage media of a digital TV and others.

If a NAND flash memory of hundreds of GB is realized, it can substitute for a hard disk drive (HDD) for a PC. As flash EEPROM nonvolatile memories, there are mainly a NOR type and a NAND type, and the NOR type has the number of times of high-speed read or read which is substantially the 13th power of 10 and is used as a command code storage for a mobile device, but it has a small effective bandwidth for write, and hence it is not suitable for file recording.

On the other hand, the NAND type can be highly integrated in comparison with the NOR type, its access time is as slow as approximately 25 µs, but burst read is possible, and this type has a high effective bandwidth. A write operation has a programming time of 200 µs to 1 ms and an erase time of approximately several ms, but the number of bits that can be programmed or erased at a time is large, and burst enables fetching write data and programming many bits at a time. Therefore, the NAND type is a memory having a high effective bandwidth, and it is widely used in the above-described markets.

BRIEF DESCRIPTION OF THE DRAWINGS

FIGS. 1A, 1B, and 1C are views each showing a memory cell configuration of a NAND flash memory according to a first embodiment;

FIGS. 3A, 3B, and 3C are views each showing capacitance coupling in memory cells in the NAND flash memory according to the comparative example and memory cells in the NAND flash memory according to the first embodiment;

FIG. 4 is a graph showing a coupling ratio of the memory cells in the NAND flash memory according to the comparative example and the memory cells in the NAND flash memory according to the first embodiment;

FIGS. 5A, 5B, 5C, and 5D are views each showing capacitance coupling of the memory cells in the NAND flash memory according to the first embodiment;

FIGS. 6A, 6B, and 6C are views each showing capacitance coupling of the memory cells in the NAND flash memory according to the first embodiment;

FIGS. 10A and 10B are a cross-sectional view in a bit line direction and a plan view showing a memory cell configuration of the NAND flash memory;

FIG. 11 is a cross-sectional view in a word line direction showing the memory cell configuration of the NAND flash memory.

DETAILED DESCRIPTION

Figure 12:
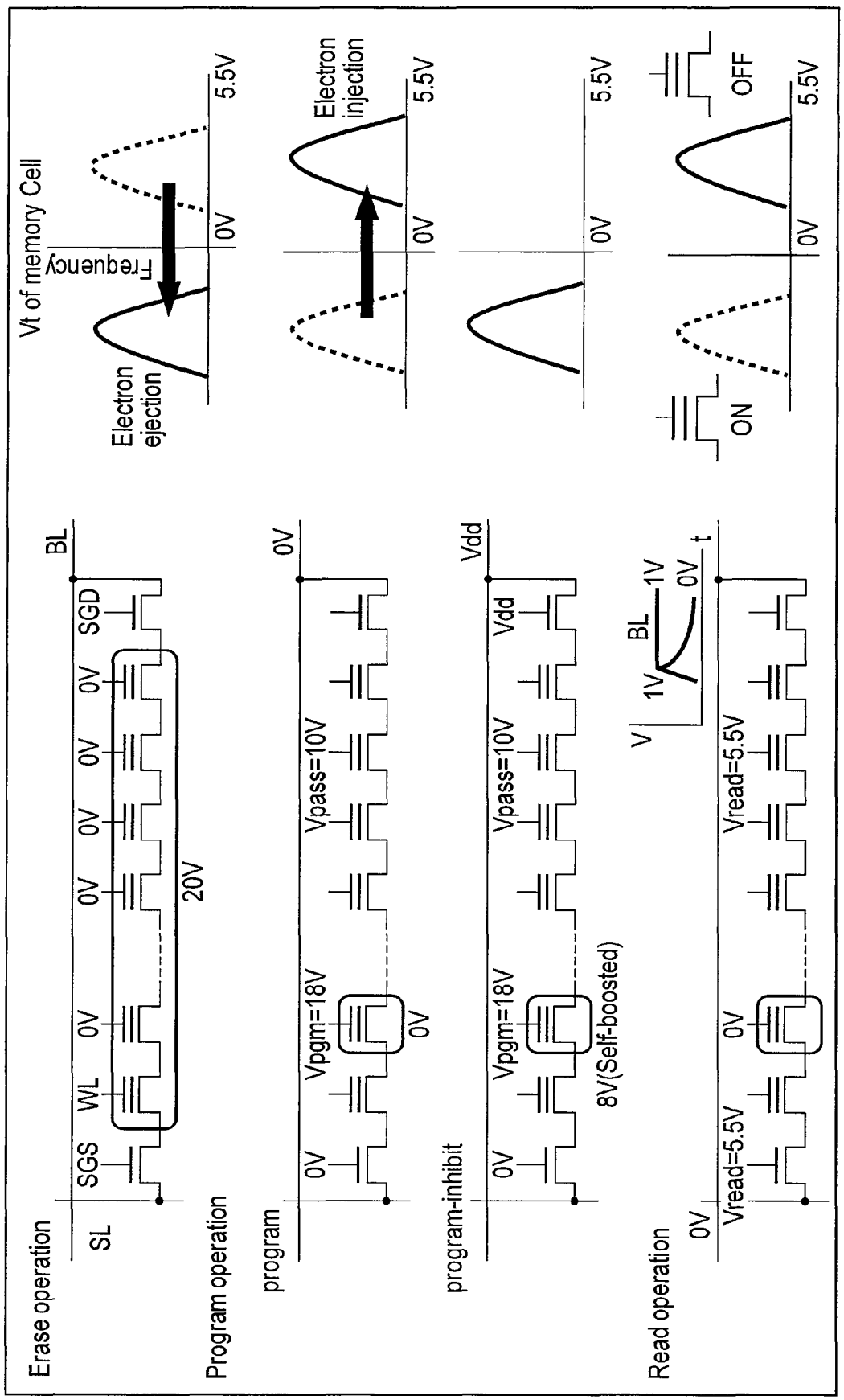
FIG. 12 is a view showing erase, programming, and read operations of the NAND flash memory.

However, in such a NAND flash memory, there is the following problem that scaling or miniaturization is difficult. FIG. 10A shows a cross section of a cell string in the NAND flash memory. FIG. 10B is a plan view showing the cell string from above. FIG. 11 shows a cross section of the cell string in a word line direction. Although a cell connected to an arbitrary word line can be independently programmed in this cell string, an erase operation enables erasing the entire selected cell string. FIG. 12 shows a specific example of programming and erase operations.

According to the erase operation, a negative voltage is applied between a gate of a cell and a channel, an electron in a floating gate is transferred from the floating gate toward the channel, and a cell threshold voltage is shifted to a negative side. According to the programming operation, a gate voltage of a selected cell alone is increased to approximately 18 V, a channel side is maintained at 0 V, and electrons are injected into the floating gate from the channel. Each non-selected cell (program inhibit) that is not subjected to the programming operation is increased to approximately 8 V on the channel side, thereby suppressing injection of electrons.

During a read, for example, a word line which is a gate of a selected cell is set to approximately 0 V, a bit line potential is kept high since no current flows through a cell String if a threshold voltage is positive, or the bit line potential is made low since a current flows through the cell String if the threshold voltage is negative. As a result, determination can be made on binary 0 and 1.

To stabilize such a NAND flash memory, a capacitance between a floating gate (FG) and a gate conductor (GC) (a word line) must be higher than a capacitance between the floating gate (FG) and a channel, and an insulating film (an inter-poly dielectric film [IPD]) must be thicker than a tunnel insulating film between the floating gate and the channel. That is because, for example, when 18 V is applied to the word line and 0 V is applied to the channel, a voltage applied between the floating gate and the channel must be higher than a voltage applied between the floating gate and the gate conductor in accordance with a capacitance ratio, and the tunnel insulating film must be thinner than the inter-poly dielectric film (IPD) so that passage of electrons can be facilitated. To meet such conditions, in the current NAND flash memory, as shown in FIG. 11, the IPD is not only formed at a portion above the floating gate but also formed on a side surface portion, an area that the floating gate is in contact with the gate conductor via the IPD is increased, and the IPD is thickly formed.

However, when a design rule for the memory cells is less than 20 nm, a size of each memory cell in a word line direction is physically determined based on FG+IPD*2+GC as shown in FIG. 11. Therefore, a floating gate (FG) size has reached a limit because of a variation in size, and a size of the gate conductor (GC) that enables burying has reached a limit. Further, the inter-poly dielectric film (IPD) has a breakdown voltage, a leakage current for maintaining data retention, and a lower limit for avoiding occurrence of program saturation due to transfer of electric charges injected into the FG from a tunnel oxide film (TNL) during programming. These factors make miniaturization of the memory cells difficult.

As described above, in the conventional NAND flash memory, advancing the scaling of memory cells is becoming difficult.

A nonvolatile memory according to an embodiment will now be described hereinafter with reference to the drawings. Here, as a nonvolatile memory, a NAND flash memory will be taken as an example. It is to be noted that like reference numbers denote constituent elements having the same functions and structures, and an overlapping description will be given only if necessary.

In general, according to one embodiment, a nonvolatile memory includes a source electrode, a drain electrode, a first gate insulating film, a first floating gate, a second gate insulating film, a gate electrode, a second floating gate, a first insulating film, a third floating gate and a second insulating film. The source electrode is formed in a semiconductor region. The drain electrode is formed in the semiconductor region to be apart from the source electrode. The first gate insulating film is formed on the semiconductor region between the source electrode and the drain electrode. The first floating gate is formed on the first gate insulating film. The second gate insulating film is formed on the first floating gate. The gate electrode is formed on the second gate insulating film. The second floating gate is formed on a first side surface of the first floating gate. The first insulating film is formed between the first floating gate and the second floating gate and has an air gap. The third floating gate is formed on a second side surface of the first floating gate on the opposite side of the first side surface. The second insulating film is formed between the first floating gate and the third floating gate.

[First Embodiment]

FIGS. 1A, 1B, and 10 show memory cells that can be applied to the NAND flash memory according to the first embodiment or any other flash memory. FIG. 1A is a plan view of a memory cell configuration, and FIGS. 1B and 10 are cross-sectional views taken along a line A-A' (a word line direction) and B-B' (a bit line direction) in FIG. 1A, respectively.

A tunnel oxide film (TNL) 12 is formed on a pwell (a semiconductor region) 11, and a channel is formed between the pwell 11 and the tunnel oxide film 12. A floating gate (FG) 13 is formed on the tunnel oxide film 12. A positive voltage is applied between the floating gate 13 and the channel, electrons are injected to perform a programming operation, a threshold voltage of a memory cell transistor is increased, and information is written. Furthermore, a negative voltage is applied between the floating gate 13 and the channel, electrons are discharged to perform an erase operation, and the threshold voltage of the memory cell transistor is reduced, and information is erased.

As shown in FIG. 1B, an inter-poly dielectric film (IPD) 14, for example, a silicon oxide film is formed on one side surface (a first side surface) of the floating gate 13. Moreover, a gate conductor (GC) 15 is buried in a side surface of the inter-poly dielectric film 14, and this gate conductor serves as a word line.

An air gap 17 is formed on a sidewall (a second side surface) on the opposite side of the first side surface of the floating gate 13 through a thin insulating film 16. Additionally, a thin insulating film 16a is formed on the side of the air gap 17, and an adjacent floating gate 13a is formed on a side surface of the insulating film 16a. In other words, in the word line direction, the thin insulating film 16 or 16a having the air gap 17 is formed on the second side surface of the floating gate 13 facing the first side surface of the same. Furthermore, the floating gate 13a of an adjacent memory cell is formed on the side surface of the insulating film 16a. It is to be noted that the insulating film 16a is the same as the insulating film 16 and the floating gate 13a is the same as the floating gate 13, but reference numbers 16a and 13a are used for explanation.

Figure 2C:
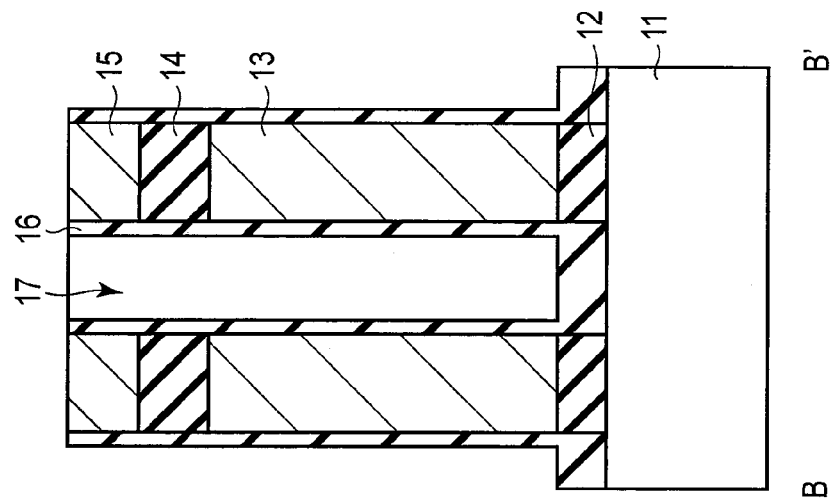
FIGS. 2A, 2B, and 2C are views each showing a memory cell configuration of a NAND flash memory according to a comparative example.
Figure 2B:
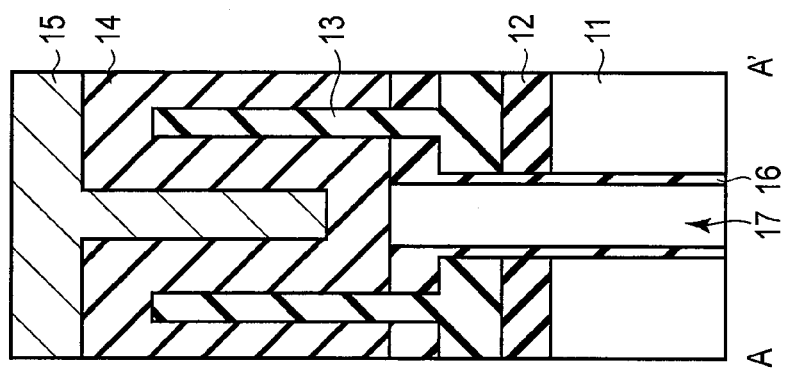
Figure 2A:
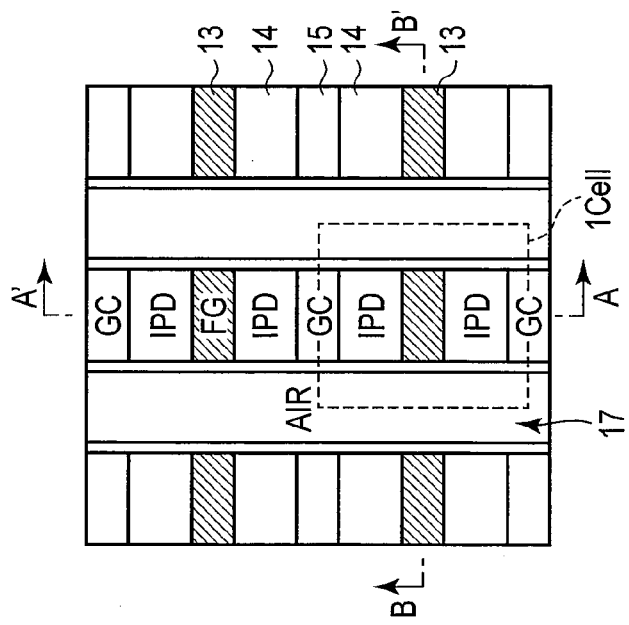

FIGS. 2A, 2B, and 2C show a memory cell configuration in which thicknesses of the floating gate, the inter-poly dielectric film, and the gate conductor can be envisaged from the NAND flash memory as a comparative example which is the same as FIGS. 1A, 1B, and 1C based on the same rule as that of FIGS. 1A, 1B, and 1C.

A considerable difference between FIGS. 1A, 1B, and 10 and FIGS. 2A, 2B, and 2C lies in that the gate conductor (GC) 15 is buried in the word line direction every two cells whereas it is buried every cell in FIGS. 2A and 2B. A second difference lies in that the buried gate conductor 15 and inter-poly dielectric films (IPD) 14 provided on both sides thereof in FIGS. 2A and 2B are substituted by the air gap 17 in FIGS. 1A and 1B.

As a result, a pitch of one cell shown in FIGS. 1A, 1B, and 10 becomes FG+IPD+(½)GC+(½)(AIR GAP), and a pitch of one cell shown in FIGS. 2A, 2B, and 2C becomes FG+2*IPD+GC. A difference between these pitches is −IPD−(½)GC+(½)(AIR GAP), and a memory cell can be reduced by an amount corresponding to a thickness of the inter-poly dielectric film (IPD) 14 per cell when the air gap 17 is formed in substantially the same size as the buried gate conductor (GC) 15.

Although depending on the design rule, the 1-bit pitch in the word line direction can be reduced to 0.7 to 0.8 times the usual value. In particular, reducing a film thickness of the inter-poly dielectric film 14 is difficult and, if the film thickness is extremely reduced (for example, less than 10 nm), there arises a problem that a leakage current is produced between the FG and the GC and program saturation (programming cannot be performed beyond a certain extent) occurs or a problem that a programming charge transfers from the FG-GC to the GC side and data retention characteristic are deteriorated, and conditions that the inter-poly dielectric film 14 is thick can bring about the great cell reduction effect in this embodiment.

As described above, when the inter-poly dielectric film (IPD) 14 is formed on only one sidewall of the floating gate (FG) 13 alone, a reduction in chip size can be realized, but there arises a problem that an FG-GC capacitance (which will be referred to as a coupling ratio (CR) hereinafter) in an overall capacitance of the floating gate 13 is reduced. That is because, when the CR is lowered, since an FG-GC capacitance ratio is reduced even though a word line potential is increased during programming, a floating gate potential cannot be sufficiently increased, a voltage is not applied between the FG and the channel, and injection of electrons is obstructed. Therefore, in this embodiment, this problem is substantially solved by interposing the air gap 17 between the FG and the FG where the gate conductor 15 is not interposed.

Plan views of FIGS. 3A, 3B, and 3C show the above-described concept.

In a memory cell configuration shown in FIG. 3A, inter-poly dielectric films (IPDs) are provided on both sides of a floating gate (FG) in the word line direction, gate conductors (GC) are provided on outer sides of these films, a relative dielectric constant of the inter-poly dielectric films is relatively high, and a parasitic capacitance with respect to a floating gate of an adjacent word line is low since an air gap is interposed. Therefore, when the floating gate has a sufficient height (when a capacitance ratio is substantially determined based on a capacitance of a sidewall of the FG), the CR of 0.5 is necessarily assured. However, if an insulating film is formed in place of the air gap between word lines adjacent to each other (no air), since a parasitic capacitance in upper and lower directions corresponds to an FG-GC capacitance in parasitic capacitances in upper, lower, left and right directions of the floating gate, the CR is deteriorated to become less than 0.5.

On the other hand, as shown in FIG. 3B, in case of forming an inter-poly dielectric film (IPD) on one sidewall of the floating gate (FG), a parasitic capacitance in one of upper and lower directions becomes an FG-GC capacitance in parasitic capacitances in upper, lower, left, and right directions (the word line direction and a direction orthogonal to the word line) of the floating gate, and the CR becomes less than 0.25. Therefore, when the floating gate has a sufficient height (when a capacitance ratio is substantially determined based on a capacitance of the sidewall of the FG), injecting electrons into the floating gate in programming is difficult in principle. Contrarily, when a word line potential is increased, a large amount of voltage is applied between the FG and FG, and electric charges transfer through the inter-poly dielectric film. However, in this case, if a low leakage current, a high breakdown voltage, and a high-dielectric material can be applied to the inter-poly dielectric film, the number of buried floating gates can be reduced, and hence a chip size can be greatly decreased.

Moreover, as shown in FIG. 3C, the inter-poly dielectric film (IPD) is formed on one of two upper and lower (the word line direction) sides of the floating gate (FG), the gate conductor (GC) is formed on this film to form an FG-GC capacitance, and the air gaps are introduced not only between the FG and the FG of an adjacent word line but also between the FG and the FG on a side where the gate conductor (GC) of the same word line is not buried. As a result, assuming that the FG-FG capacitance is, for example, 4, a capacitance of the air gap side on the opposite side of the floating gate (FG) in the vertical direction is 1, and the FG-FG capacitance with respect to each of the left and right adjacent word lines is 1, if the floating gate has a sufficient height (if a capacitance ratio is substantially determined based on a capacitance of the sidewall), the CR becomes approximately 0.5, and programming can be sufficiently performed.

In this manner, when the inter-poly dielectric film (IPD) 14 is formed on one sidewall of the floating gate (FG) alone, introducing the air gap 17 on the sidewall on the opposite side enables reducing the CR to some extent in comparison with a conventional cell, but introducing the floating gate having a sufficient height or reducing a film thickness of the inter-poly dielectric film enables realizing the CR that is equivalent to that of the conventional cell. FIG. 4 is a graph where an abscissa represents a floating gate height and an ordinate represents a CR. In a conventional example, when the floating gate height is 1, the CR is approximately 0.43 or 0.57 depending on presence/absence of an air gap. On the other hand, in this embodiment, the CR is deteriorated to approximately 0.26 when no air gap is provided, but the CR is improved to 0.42 when the air gap is introduced to the sidewall of the floating gate opposite to the sidewall on which the inter-poly dielectric film is formed. Further, it can be understood that the CR that is equivalent to that in a conventional cell can be assured by increasing a height of the floating gate or raising a relative dielectric constant Er of the inter-poly dielectric film to some extent. For example, when the floating gate (FG) height=2 and the relative dielectric constant Er of the inter-poly dielectric film (IPD) is 1.5 times the usual value, the CR is 0.58 which is better than that in the conventional cell.

FIGS. 5A, 5B, and 5C show component analysis results of respective capacitances in a total capacitance of the floating gate when the air gap is formed and the inter-poly dielectric film (IPD) is formed on one side of the floating gate (FG) (FIGS. 5A and 5B) and when the inter-poly dielectric films are formed on both sides of the floating gate (FIG. 5C).

FIG. 5D shows which capacitance coupling with the floating gate corresponds to each of (1) to (4) shown in FIGS. 5A, 5B, and 5C.

As shown in FIG. 5A, when the inter-poly dielectric film (IPD) is formed on one side surface of the floating gate (FG), the CR can be evidently assured to some extent, but the CR is lowered under similar conditions based on the CR definition in comparison with a case where the inter-poly dielectric films are formed on both side surfaces of the conventional floating gate. In particular, the CR between the FG and FG (1) having the air gap interposed therebetween is remarkably increased. However, this (1) corresponds to the floating gates (FG) of the memory cells connected to the same word line and, as represented by an equivalent circuit in FIG. 5B, a selected word line potential is increased, a potential in an FG node of the adjacent (1) in this coupling is also increased, and a potential in the floating gate of note in this coupling is also increased. Therefore, since 48% of a capacitance of the FG in the adjacent (1) is substantially coupled with a selected word line in tandem with selection of the selected word line (the gate conductor [GC]), 48% of a value in (1) and also 48% of a value in (4) are substantially coupled with the gate conductor. When this component is included in coupling of the FC of note and the GC as seen from the floating gate (FG) of note, a substantial component of the CR is as shown in FIG. 5B, and it is possible to substantially achieve CR=0.56 which is the same as that in the case where the inter-poly dielectric films are formed on both the side surfaces of the conventional floating gate depicted in FIG. 5C.

As described above, according to this embodiment, in comparison with the case where the inter-poly dielectric films (IPD) are formed on both the side surfaces of the conventional floating gate (FG), a cell size can be reduced to 70 to 80%, the substantial CR can be maintained constant, and an operation margin and reliability can be assured to the same extents.

FIGS. 6A and 6B show component analysis results of respective capacitances in a total capacitance of the floating gate when the inter-poly dielectric film (IPD) is formed on one side of the floating gate (FG) and the air gap is applied to the surface of the floating gate opposite to the IPD (FIG. 6A) and when the air gap is not applied (FIG. 6B). FIG. 6C shows which capacitance coupling with the floating gate corresponds to each of (1) to (3) shown in FIGS. 6A and 6B. FG-GC shown in FIG. 6A is sufficiently larger than FG-GC depicted in FIG. 6B, and it can be understood that this embodiment can obviously have an enhanced effect when the air gap is applied.

Figure 7E:
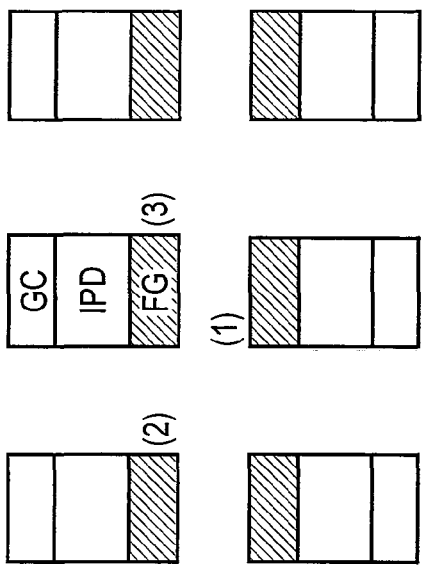
FIGS. 7A, 7B, 7C, 7D, and 7E are views each showing capacitance coupling of the memory cells in the NAND flash memory according to the first embodiment.

FIGS. 7A to 7D show component analysis results of the CR when the inter-poly dielectric film (IPD) is formed on one side of the floating gate (FG) and the air gap is applied to the surface of the floating gate opposite to the IPD. FIG. 7E shows each capacitance coupling with the floating gate corresponds to each of (1) to (3) depicted in FIGS. 7A to 7D.

Figure 7A:
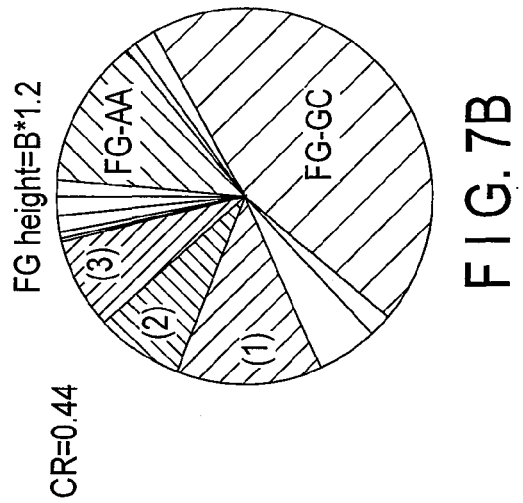
Figure 7B:
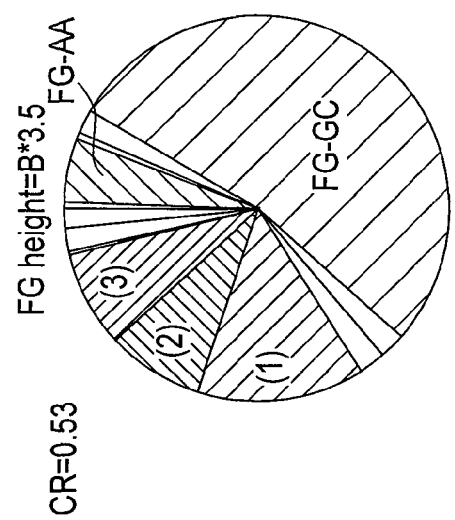
Figure 7C:
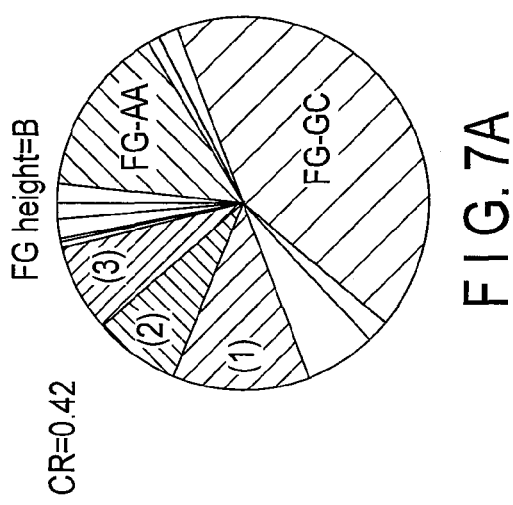
Figure 7D:
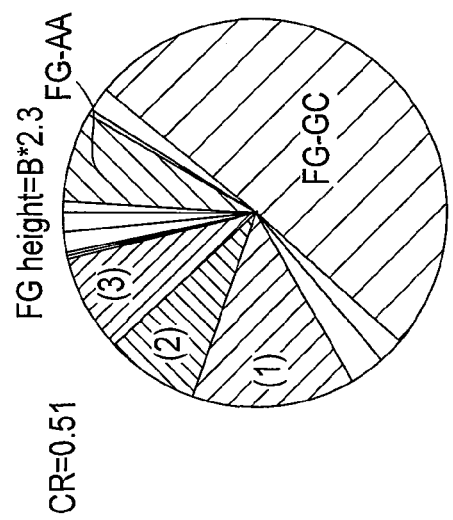

As shown in FIG. 7A, when a height of the floating gate is B, CR=0.42 is achieved. Furthermore, as shown in FIGS. 7B, 7C, and 7D, when a height of the floating gate (FG) is B*1.2, B*2.3, or B*3.5, the CR becomes 0.44, 0.51, or 0.53, respectively. As a result, it can be understood that this embodiment is obviously effective when the height of the floating gate (FG) is increased.

[Second Embodiment]

In a second embodiment, a description will be given as to an example where an angle (a taper angle) of a side surface of a floating gate where an inter-poly dielectric film (IPD) is formed is less than 90 degrees.

Figure 8A:
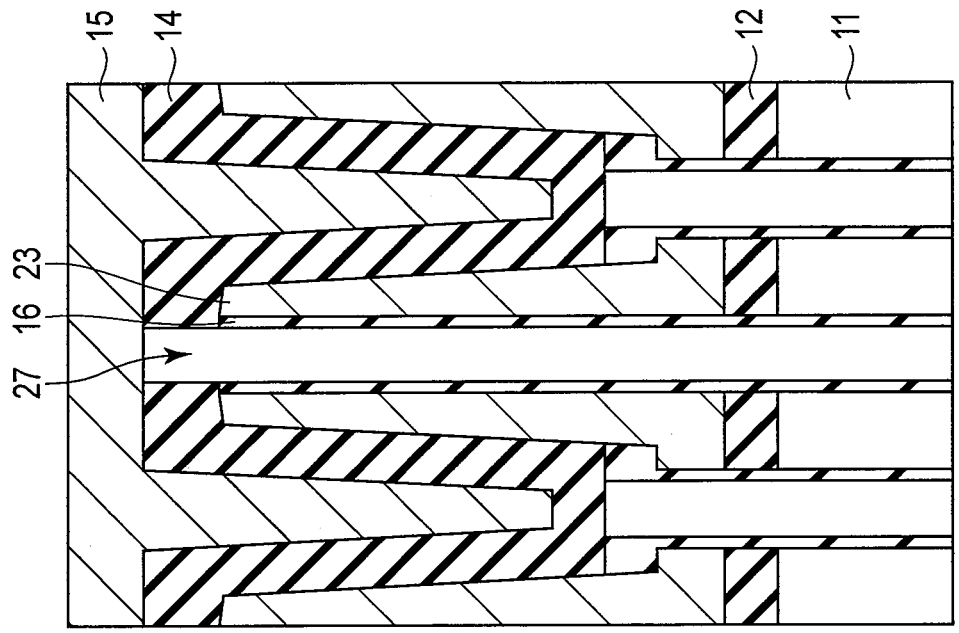
FIG. 8A is a cross-sectional view showing a memory cell configuration of a NAND flash memory according to a second embodiment.

FIG. 8A is a cross-sectional view of a memory cell which can be applied to, for example, a NAND flash memory according to the second embodiment, and shows a cross section in a word line direction.

As shown in the drawing, an angle of a side surface (a first side surface) of a floating gate (FG) 23 where an inter-poly dielectric film (IPD) 14 is formed is less than 90 degrees. That is, an interior angle formed between the first side surface of the floating gate 23 and a surface of a pwell (a semiconductor region) 11 is smaller than 90 degrees.

As a result, a memory cell configuration shown in FIG. 8A can be easily manufactured. Since a bottom size of each gate conductor 15 buried in the inter-poly dielectric film 14 is smaller than a top size of the same, the gate conductor 15 can be easily buried. Other structures and effects are the same as those in the first embodiment.

[Third Embodiment]

In a third embodiment, as in the second embodiment, a description will be given as to an example where an angle (a taper angle) of a side surface of a floating gate (FG) on which an inter-poly dielectric film (IPD) is formed is less than 90 degrees and an air gap formed between the floating gates is extended to an upper gate conductor.

Figure 8B:
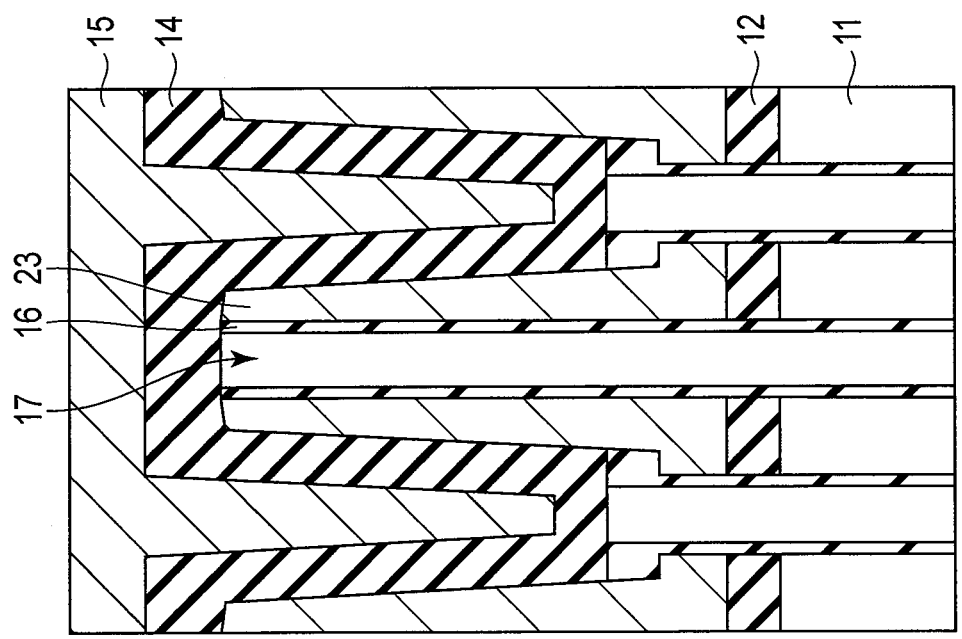
FIG. 8B is a cross-sectional view showing a memory cell configuration of a NAND flash memory according to a third embodiment.

FIG. 8B is a cross-sectional view of a memory cell that can be applied to a NAND flash memory according to the third embodiment, and shows a cross section in a word line direction.

As in the second embodiment, an angle of a side surface (a first side surface) of a floating gate (FG) 23 on which an inter-poly dielectric film (IPD) 14 is formed is less than 90 degrees. That is, an interior angle formed between the first side surface of the floating gate 23 and a surface of a pwell (a semiconductor region) 11 is smaller than 90 degrees. In the third embodiment, an air gap 27 formed between the floating gate 23 and a floating gate 23a of an adjacent memory cell is extended to an upper gate conductor 15. It is to be noted that the floating gate 23 is the same as the floating gate 23a, but 23a is used for explanation.

Further, in addition to this example, the gate conductor 15 does not have to be buried between the FG and the FG which substantially face each other, and the air gap may be formed to reduce a capacitance between the FG and the FG.

As one problem of this embodiment, even if coupling with a word line of an adjacent floating gate (FG) is apportioned to coupling of a word line of a floating gate of note as depicted in FIG. 5B showing component analysis of a substantial coupling ratio (CR), there is a drawback that a coupling amount between the FG and the FG adjacent to each other on the air gap side is still slightly increased in comparison with a case where inter-poly dielectric films (IPD) are formed on both side surfaces of a conventional floating gate.

Figure 9A:
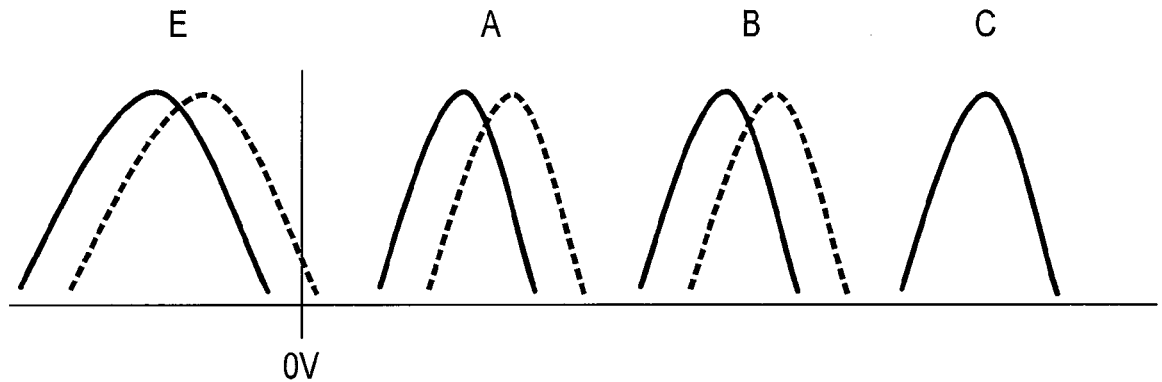
FIGS. 9A and 9B are views each showing a programming method for memory cells in a NAND flash memory according to an embodiment.

In this case, when a programming operation is performed with respect to the adjacent cell of the selected word line, a potential in the floating gate increases due to coupling even though the cell of note is changed to a program-inhibit state, write disturbance occurs, and a problem that a threshold voltage Vt of the cell of note may be possibly changed. FIG. 9A shows this influence. When the FG adjacent to the air gap side is subjected to the programming operation so that it is changed to a C level having the highest threshold level, E, A, and B levels of the cell adjacent to the air gap rise.

Figure 9B:
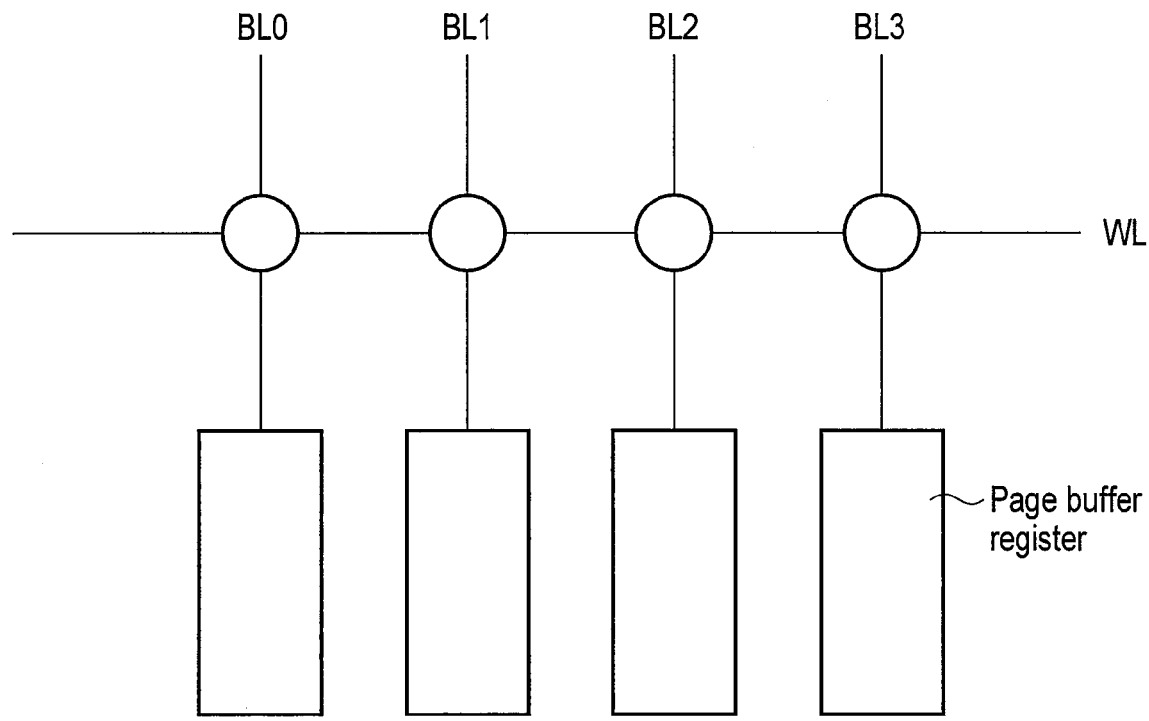

FIG. 9B shows a circuit operation system that avoids the above-described problem. In regard to the write disturbance that is deteriorated in this embodiment, since cells whose coupling between the FG and the FG according to this embodiment are cells connected to the same word line, data required to effect the programming to achieve the E, A, B, and C levels at the same time can be stored in a register of a page buffer at an array end. Therefore, assuming that K01 is a coefficient between the FG and FG having the air gap and K02 is a coefficient between the FG and FG having the gate conductor interposed between, when a shift amount of a threshold voltage Vt in the programming is N (N=0, 1, 2, 3) in E, A, B, and C, an amount of the programming of the cell of note connected to a bit line BL1 is N−K01*$N_{BL0}$−K02*$N_{BL2}$. In this manner, this problem can be avoided by previously subtracting (the coefficient K01 or K12) that causes a change in adjacent threshold voltage. It is needless to say that, if K01>K02 is achieved and K02 is sufficiently small in this case, the coefficient K01 between the FG and the FG having the air gap alone may be considered.

[Effect]

In conventional examples, a 1-cell pitch in the word line direction is determined based on the 1-cell pitch=(floating gate [FG]+inter-poly dielectric film [IPD]×2+buried gate conductor [G]), and miniaturization is difficult. In this embodiment, since the same is determined based on the 1-cell pitch=(floating gate [FG]+inter-poly dielectric film [IPD]+(½) buried gate conductor [GC]+(½) air gap), the 1-cell pitch can be miniaturized to approximately ¾, and a chip cost can be decreased.

Moreover, since each gate conductor (GC) interposed between the floating gates (FG) is eliminated every two floating gates, a ratio of a capacity of the gate conductor in an overall capacitance of the floating gate is decreased, but interposing the air gap to compensate absence of the gate conductor enables assuring the ratio of the capacitance of the gate conductor in the overall capacitance of the floating gate to some extent, a potential in the floating gate of the cell which is a target of programming can be sufficiently increased when a word line potential is raised during programming, thus sufficiently effecting programming.

As described above, according to this embodiment, in the flash EEPROM nonvolatile memory, for example, the NAND flash memory, the memory cell pitch in the word line direction can be reduced without extremely advancing a reduction in film thickness of the inter-poly dielectric film (IPD), a cost can be decreased, the capacitance between the FG and the GC in the total capacitance of the floating gate (FG) can be kept at a certain level or more, and desired programming and reliability can be maintained.

In regard to the nonvolatile memory, for example, the NAND flash memory in which a reduction in film thickness of the inter-poly dielectric film and further miniaturization of the floating gate and the gate conductor are difficult and reducing the size of each cell is correspondingly difficult, this embodiment provides the non-volatile memory that can assure reliability and reduce a size of each memory cell to approximately ¾ without performing further miniaturization.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory comprising:
a source electrode formed in a semiconductor region;
a drain electrode formed in the semiconductor region to be apart from the source electrode;
a first gate insulating film formed on the semiconductor region between the source electrode and the drain electrode;
a first floating gate formed on the first gate insulating film;
a second gate insulating film formed on the first floating gate;
a gate electrode formed on the second gate insulating film;
a second floating gate formed on a first side surface of the first floating gate;
a first insulating film which is formed between the first floating gate and the second floating gate and has an air gap;
a third floating gate formed on a second side surface of the first floating gate on an opposite side from the first side surface; and
a second insulating film formed between the first floating gate and the third floating gate.

2. The nonvolatile memory according to claim 1, further comprising a word line including the gate electrode,
wherein the first, second, and third floating gates are arranged in the word line direction.

3. The nonvolatile memory according to claim 2, further comprising fourth and fifth floating gates arranged in a direction crossing the word line,
wherein the fourth and fifth floating gates sandwich the first floating gate.

4. The nonvolatile memory according to claim 3, further comprising:
a third insulating film which is formed between the first floating gate and the fourth floating gate and has an air gap; and
a fourth insulating film which is formed between the first floating gate and the fifth floating gate and has an air gap.

5. The nonvolatile memory according to claim 1, wherein the second gate insulating film and the first and second insulating films are the same continuously formed film.

6. The nonvolatile memory according to claim 4, wherein the second gate insulating film and the third and fourth insulating films are the same continuously formed film.

7. The nonvolatile memory according to claim 1, wherein an electrical capacitance between the first floating gate and the gate electrode is 40% or more with respect to an entire electrical capacitance of the first floating gate.

8. The nonvolatile memory according to claim 1, wherein an interior angle formed between the second side surface of the first floating gate and a surface of the semiconductor region is smaller than an interior angle formed between the first side surface of the first floating gate and the surface of the semiconductor region.

9. The nonvolatile memory according to claim 1, wherein part of the gate electrode is arranged between the second insulating film and the third floating gate.

10. A nonvolatile memory comprising:
a source electrode formed in a semiconductor region;
a drain electrode formed in the semiconductor region to be apart from the source electrode;
a first gate insulating film formed on the semiconductor region between the source electrode and the drain electrode;
a first floating gate formed on the first gate insulating film;
a second gate insulating film formed on the first floating gate;
a gate electrode formed on the second gate insulating film;
a second floating gate formed on a first side surface of the first floating gate, with an air gap being interposed between the first floating gate and the second floating gate;
a third floating gate formed on a second side surface of the first floating gate on an opposite side from the first side surface; and
an insulating film formed between the first floating gate and the third floating gate.

11. The nonvolatile memory according to claim 10, further comprising a word line including the gate electrode,
wherein the first, second, and third floating gates are arranged in the word line direction.

12. The nonvolatile memory according to claim 11, further comprising fourth and fifth floating gates arranged in a direction crossing the word line,
wherein the fourth and fifth floating gates sandwich the first floating gate.

13. The nonvolatile memory according to claim 12, wherein the fourth floating gate is arranged on a third side surface of the first floating gate in the direction crossing the word line, with an air gap being interposed between the first floating gate and the fourth floating gate, and
the fifth floating gate is arranged on a fourth side surface of the first floating gate on an opposite side from the third side surface, with an air gap being interposed between the first floating gate and the fifth floating gate.

14. The nonvolatile memory according to claim 10, wherein the second gate insulating film and the insulating film are the same continuously formed film.

15. The nonvolatile memory according to claim 10, wherein an electrical capacitance between the first floating gate and the gate electrode is 40% or more with respect to an entire electrical capacitance of the first floating gate.

16. The nonvolatile memory according to claim 10, wherein an interior angle formed between the second side surface of the first floating gate and a surface of the semiconductor region is smaller than an interior angle formed between the first side surface of the first floating gate and the surface of the semiconductor region.

17. The nonvolatile memory according to claim 10, wherein part of the gate electrode is arranged between the second insulating film and the third floating gate.

18. A nonvolatile memory comprising:
a first memory cell;
a second memory cell arranged on a first direction side of the first memory cell;

a third memory cell arranged on a second direction side opposite to the first direction of the first memory cell, each of the first, second, and third memory cells comprising:
- a source electrode formed in a semiconductor region;
- a drain electrode formed in the semiconductor region to be apart from the source electrode;
- a first gate insulating film formed on the semiconductor region between the source electrode and the drain electrode;
- a floating gate formed on the first gate insulating film;
- a second gate insulating film formed on the floating gate; and
- a gate electrode formed on the second gate insulating film, a first insulating film which is formed between the floating gate of the first memory cell and the floating gate of the second memory cell and has an air gap; and a second insulating film which is formed between the floating gate of the first memory cell and the floating gate of the third memory cell and has no air gap.

19. The nonvolatile memory according to claim 18, wherein, in the first memory cell, an electrical capacitance between the floating gate and the gate electrode is 40% or more with respect to an entire electrical capacitance of the floating gate.

20. The nonvolatile memory according to claim 18, wherein, in the first memory cell, an interior angle formed between a side surface of the floating gate where the second insulating film is arranged and a surface of the semiconductor region is smaller than an interior angle formed between a side surface of the floating gate where the first insulating film is arranged and the surface of the semiconductor region.

* * * * *